United States Patent [19]
Vilkinofsky et al.

[11] Patent Number: 6,060,834
[45] Date of Patent: May 9, 2000

[54] PROTECTION FROM OVERHEATING OF A SWITCHING TRANSISTOR THAT DELIVERS CURRENT TO A DAYTIME RUNNING LIGHT ON A VEHICLE

[75] Inventors: John W. Vilkinofsky, Columbus, Ohio; Shinichi Kubozuka, Ota, Japan; Yasunobu Onozato, Kiryu, Japan; Kiyohumi Nakayama, Azuma-mura, Japan

[73] Assignees: Honda Giken Kogyo Kabushiki Kaisha; Mitsuba Corporation, both of Japan

[21] Appl. No.: 09/164,032

[22] Filed: Sep. 30, 1998

[51] Int. Cl.[7] .................................................. H05B 37/02
[52] U.S. Cl. ........................... 315/82; 315/119; 307/10.8
[58] Field of Search .................................. 315/82, 83, 77, 315/119, 120, 123, 124, 125, 127; 307/10.8

[56] References Cited

U.S. PATENT DOCUMENTS

| | | |
|---|---|---|
| 4,360,852 | 11/1982 | Gilmore . |
| 4,595,966 | 6/1986 | Huber et al. . |
| 4,750,079 | 6/1988 | Fay et al. . |
| 4,800,331 | 1/1989 | Vesce et al. . |
| 4,926,283 | 5/1990 | Qualich . |
| 5,272,392 | 12/1993 | Wong et al. . |
| 5,383,083 | 1/1995 | Shinoda et al. . |
| 5,390,069 | 2/1995 | Marshall . |
| 5,438,237 | 8/1995 | Mullins et al. . |
| 5,694,282 | 12/1997 | Yockey . |

*Primary Examiner*—David Vu
*Attorney, Agent, or Firm*—Monica H. Choi

[57] ABSTRACT

A protection circuit protects from overheating a switching transistor that delivers current from a power source to a daytime running light on a vehicle. The protection circuit of the present invention open-circuits the switching transistor from the power source when the temperature at the switching transistor is sensed to be above a predetermined temperature. In this manner, excessive current is prevented from flowing through the switching transistor. In contrast, prior art protection circuits control only the gate of a MOSFET or base of a BJT switching transistor. In that case, if damage to the transistor results in an effective resistance, constant flow of current through such an effective resistance results in excessive overheating or even a fire. The protection circuit of the present invention open-circuits the conductive path from the power source through the effective resistance such that current does not flow through the effective resistance. Furthermore, a latching circuit in the protection circuit of the present invention maintains the switching transistor to be open-circuited from the power source once the temperature at the switching transistor reaches the predetermined temperature. Thus, the traffic hazard or degradation of the switching transistor, which may result from the daytime running light flashing on and off, are also avoided with the protection circuit of the present invention.

28 Claims, 3 Drawing Sheets

PROTECTION FROM OVERHEATING OF A SWITCHING TRANSISTOR THAT DELIVERS CURRENT TO A DAYTIME RUNNING LIGHT ON A VEHICLE

TECHNICAL FIELD

This invention relates to circuits for controlling daytime running lights on vehicles, and more particularly to a circuit for protecting from overheating a switching transistor that delivers current to a daytime running light on a vehicle.

BACKGROUND OF THE INVENTION

Daytime running lights augment vehicle safety by enhancing the visibility of a vehicle having daytime running lights. Thus, daytime running lights are becoming a more common feature on vehicles. Because of the recognized importance of daytime running lights on vehicles, Canada has legislated to require daytime running lights on vehicles that are sold in Canada.

In daytime running lights on a vehicle, a high-power output switching transistor delivers current to a high wattage daytime running light bulb filament on the vehicle. Referring to FIG. 1, a high-power MOSFET (Metal Oxide Semiconductor Field Effect Transistor) 102 is used to deliver current from a power source 104 to the filament of a daytime running light 106. The intensity (and thus the brightness) of the daytime running light is determined by the duty cycle of a switched DC voltage applied to the gate of the MOSFET 102.

Note, that a high power BJT (Bipolar Junction Transistor) may be used instead of the MOSFET 102 to deliver current from the power source 104 to the filament of the daytime running light 106. As would be apparent to one of ordinary skill in the art, the present invention may be used in conjunction with a MOSFET or a BJT or any other type of high power switching device from the description herein. The MOSFET 102 is shown as an example switching device. However, a MOSFET may be preferred as the switching device rather than a BJT because of the higher switching speed and lower resistance of a MOSFET when the MOSFET is turned on.

The power source 104 is typically from a battery system of the vehicle, and the battery system includes a fuse which blows and open-circuits the drain of the MOSFET 102 from the power source 104 when excessive current flows though such a fuse. However, a partial short load 108 may be coupled to the source of the MOSFET 102. The partial short load 108 has an impedance which is not low enough to blow the fuse of the battery system. Nevertheless, the impedance of the partial short load 108 may be low enough to cause high current to flow through the switching MOSFET 102.

Such high current flowing through the switching MOSFET 102 results in high heat and thus damage to the switching MOSFET 102. The damage to the switching MOSFET 102 results in an effective resistance 110. As high current continues to flow through the effective resistance 110, excessive overheating and/or even a fire may result in malfunction of the daytime running light system and could potentially be a further hazard to the vehicle.

Prior art protection circuits, for preventing damage to the switching transistor 102, control the current flowing though the switching transistor 102 by controlling the gate voltage if the switching transistor is a MOSFET or by controlling the base current if the switching transistor is a BJT (Bipolar Junction Transistor). U.S. Pat. No. 4,926,283 to Qualich, U.S. Pat. No. 4,595,966 to Huber et al, U.S. Pat. No. 4,750,079 to Fay et al., U.S. Pat. No. 5,272,392 to Wong et al., U.S. Pat. No. 5,390,069 to Marshall, U.S. Pat. No. 5,438,237 to Mullins et al., and U.S. Pat. No. 5,694,282 to Yockey, teach a protection circuit 112 which controls the current flowing through a MOSFET output transistor by correspondingly controlling the gate to source voltage of the MOSFET output transistor. U.S. Pat. No. 4,360,852 to Gilmore and U.S. Pat. No. 4,800,331 to Vesce et al., teach a protection circuit 112 which controls the current flowing through a BJT output transistor by correspondingly controlling the base current of the BJT output transistor.

Unfortunately, with the prior art protection circuit 112, a conductive path still exists from the power source 104 through the effective resistance 110 of the damaged MOSFET 102 to the partial short load 108. Even with the prior art protection circuit 112, excessive current may still flow through such a conductive path. Such excessive current may cause sufficient damage to the switching transistor 102 such that the daytime running light becomes inoperative. Additionally, such excessive current may cause excessive overheating and even a fire resulting in further hazard to the vehicle.

In addition, the prior art protection circuit 112 does not include a latching circuit to keep the daytime running light turned off once the switching transistor reaches an excessive temperature. Without the latching circuit, the daytime running light may flash on and off as the switching transistor alternately cools off and turns back on and then heats up and turns back off from the mechanism of the prior art protection circuit. Such flashing on and off of the daytime running light may be a traffic hazard on the road and also causes further degradation of the switching transistor 102.

SUMMARY OF THE INVENTION

Accordingly, in light of these disadvantages of the prior art protection circuit, the present invention is an improved mechanism for protecting from overheating a switching transistor that delivers current from a power source to a daytime running light on a vehicle. The protection circuit of the present invention open-circuits the switching transistor from the power source when the temperature at the switching transistor is sensed to be above a predetermined temperature. In this manner, the conductive path from the power source through the switching transistor is open-circuited such that current cannot continuously flow through the switching transistor. Thus, overheating of the switching transistor from excessive current flow is prevented with the present invention.

Furthermore, a latching circuit in the protection circuit of the present invention maintains the switching device to be turned off once the temperature at the switching transistor reaches the predetermined temperature.

Generally, the present invention is a circuit for protecting a switching transistor from overheating. The switching transistor drives a daytime running light on a vehicle by delivering current from a power source to a daytime running light filament. The circuit of the present invention includes a sensor, such as a thermistor, operatively coupled to the switching transistor, for monitoring temperature at the switching transistor. The circuit of the present invention also includes a switching device, such as a relay switch, operatively coupled between the power source and the switching transistor. The switching transistor delivers current from the power source to the daytime running light when the switching device is closed. In addition, the circuit of the present invention includes a control circuit, operatively coupled to the sensor and the switching device, for controlling the switching device to open when the sensor senses that the temperature at the switching transistor is greater than a predetermined temperature to open-circuit the switching transistor from the power source.

The present invention may be used to particular advantage when the circuit of the present invention further includes a latching circuit for maintaining the switching device open once the switching device has been opened. The switching device closes again when the temperature at the switching transistor has returned to being lower than the predetermined temperature and when the power source is reapplied to the protection circuit.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1–4 refer to elements having similar structure and function.

DETAILED DESCRIPTION

Figure 2:
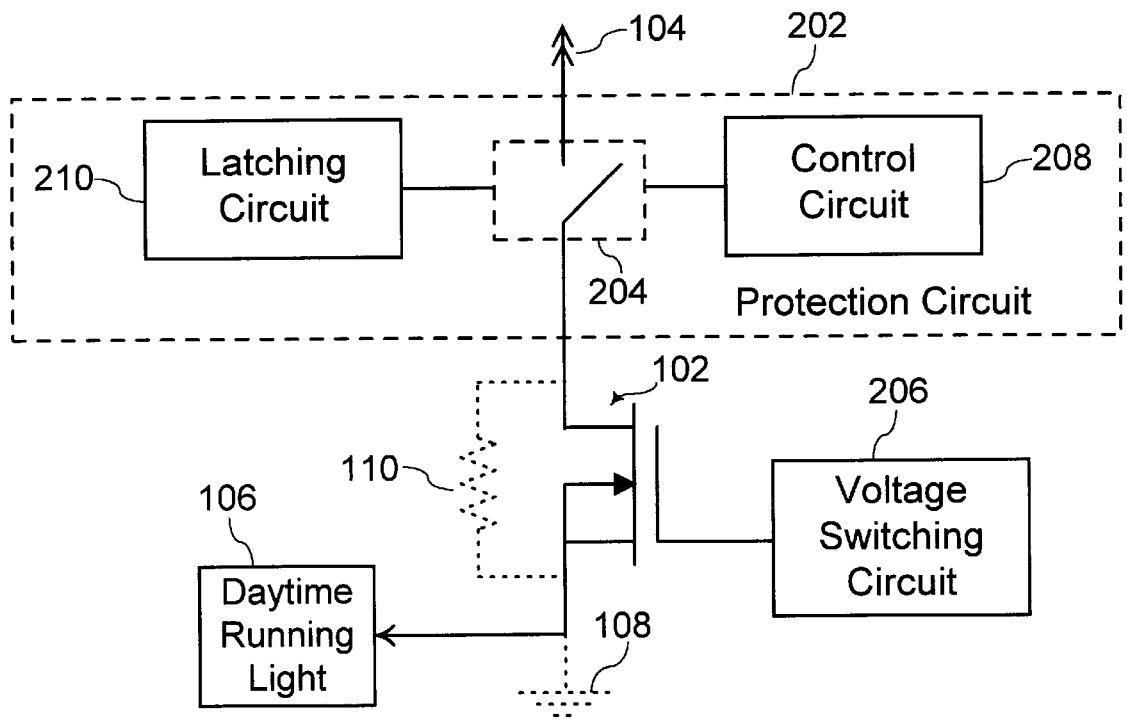
FIG. 2 shows a switching transistor for delivering power to a daytime running light on a vehicle and shows a block diagram of a protection circuit for protecting the switching transistor from overheating, according to the present invention.

Referring to FIG. 2, a protection circuit 202 of the present invention for protecting the switching transistor 102 from overheating includes a switching device 204 coupled between the power source 104 and the drain of the switching transistor 102. The switching transistor 102 delivers current from the power source 104 to the filament of the daytime running light 106 when the switching device 204 is closed. A voltage switching circuit 206 drives the gate of the switching transistor 102 with a switched DC voltage having a duty cycle that determines the power and thus intensity (i.e., the brightness) of the daytime running light 106. The voltage switching circuit 206 may be implemented in any way known to one of ordinary skill in the art for switching a DC voltage.

A sensor (not shown in FIG. 2) is coupled to the switching transistor 102 for monitoring the temperature at the switching transistor 102. When the temperature at the switching transistor 102 is sensed to be greater than a predetermined temperature, a control circuit 208, coupled to the sensor and the switching device 204, controls the switching device 204 to open. When the switching device 204 opens, the drain of the switching transistor 102 is open-circuited from the power source 104 such that current cannot flow from the drain to the source of the switching transistor 102.

By thus preventing excessive current flow through the switching transistor 102, the switching transistor 102 is prevented from further overheating due to excessive current flow through the effective resistance 110 of the switching transistor 102. The effective resistance 110 results from damage to the MOSFET 102 when high current flows through the MOSFET 102 during a reaction time of the protection circuit 202.

Additionally, the present invention includes a latching circuit 210 coupled to the switching device 204 for maintaining the switching device 204 open until the temperature at the MOSFET 102 is below the predetermined temperature and until the power source 104 is reapplied to the protection circuit 202. Without the latching circuit, the switching device 204 may alternately open and close as the switching transistor alternately cools off after the switching device 204 is opened and heats up after the switching device 204 is closed. Such a repeated opening and closing of the switching device 204 leads to further degradation of the switching transistor 102 and to undesirable flashing on and off of the daytime running light which may be a traffic hazard on the road.

Thus, a latching circuit 210 is included to maintain the switching device 204 to be opened once the temperature at the switching transistor 102 reaches a predetermined temperature. The switching device 204 closes again when the temperature at the MOSFET 102 is below the predetermined temperature and when the power source 104 is reapplied to the protection circuit 202.

Figure 3:
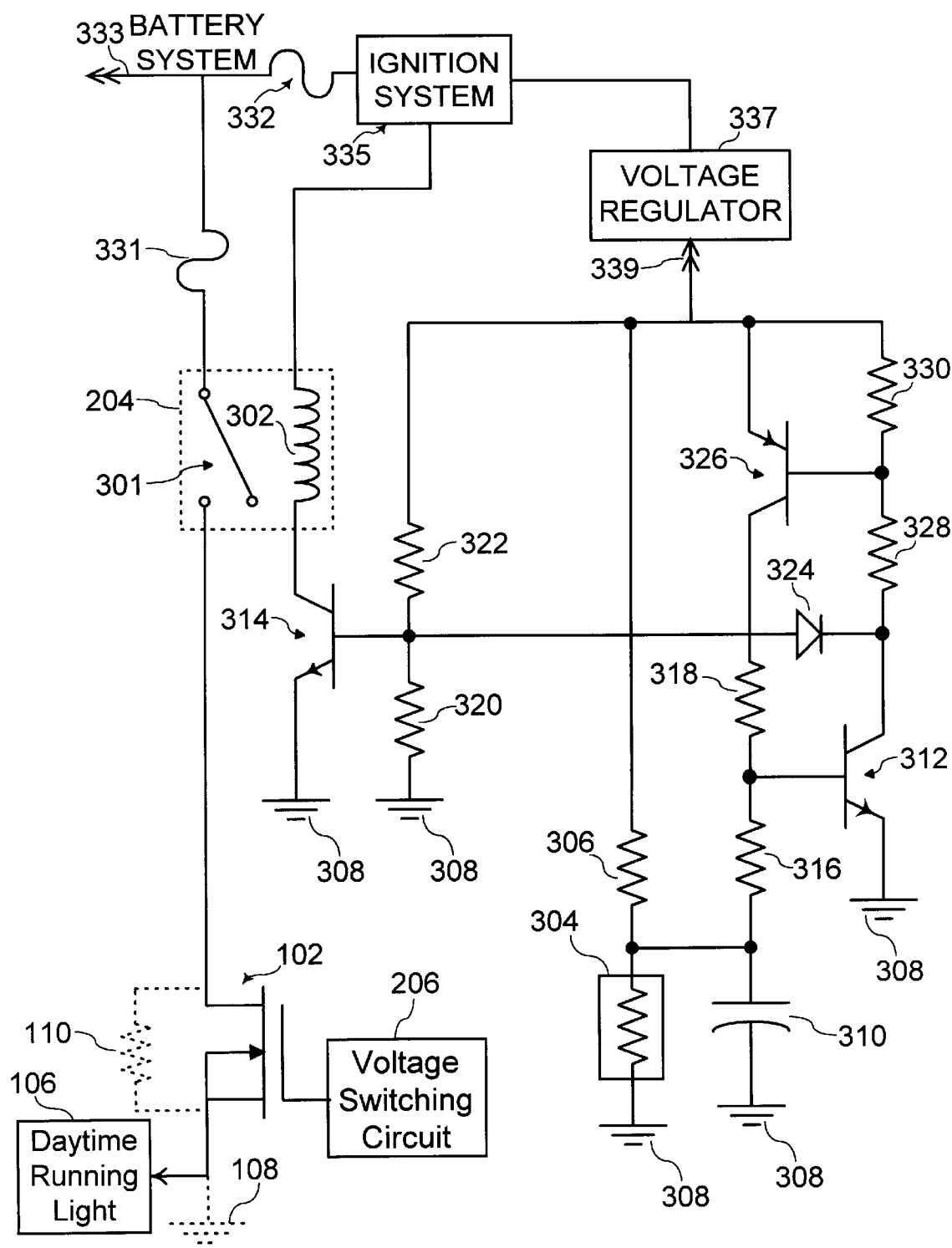
FIG. 3 shows implementation of the protection circuit for protecting the switching transistor as shown in FIG. 2, according to one embodiment of the present invention.

Referring to FIG. 3, an example implementation of the protection circuit 202 of FIG. 2 is shown. The switching device 204 is comprised of a relay switch 301 which is controlled to open and close depending on the current flowing through a coil 302. The relay switch 301 is coupled between the drain of the switching MOSFET 102 and a battery system 333 via a first fuse 331. The coil 302 is coupled to the battery system 333 via a second fuse 332 and an ignition system 335 of the vehicle. If sufficient current flows through the coil 302, then the relay switch 301 is closed; otherwise, the relay switch 301 is opened.

The sensor for monitoring the temperature at the switching transistor 102 is a thermistor 304. The thermistor 304 is disposed to form a temperature-conductive path with the switching transistor 102. For example, the thermistor 304 may be disposed on a heat sink mounted to a junction of the switching transistor 102. The thermistor 304 has a resistance that varies with temperature. The thermistor 304 is coupled as a resistive-divider with a first resistor 306 between a regulated voltage node 339 from a voltage regulator 337 and a ground node 308.

The control circuit 208 of FIG. 2 is comprised of a first BJT (Bipolar Junction Transistor) 312 and a second BJT (Bipolar Junction Transistor) 314 in FIG. 3. A capacitor 310 may be connected in parallel with the thermistor 304 to provide filtering of electrical noise that may otherwise cause inappropriate operation of the first BJT 312. The present invention may be practiced with or without the inclusion of the capacitor 310. A second resistor 316 and a third resistor 318 form a voltage divider for biasing the base of the first BJT 312. A fourth resistor 320 and a fifth resistor 322 form a voltage divider for biasing the base of the second BJT 314.

The control circuit 208, comprising the first BJT 312 and the second BJT 314 in FIG. 3, operates in the following manner. When the temperature at the switching transistor 102 rises, the temperature and thus the resistance of the thermistor 304 increases. As a result, the voltage at the base and thus the collector current of the first BJT 312 increase. The collector of the first BJT 312 is coupled to the base of the second BJT 314 via a diode 324. Thus, when the collector current of the first BJT 312 increases, the base current of the second BJT 314 decreases. When the base current of the second BJT 314 decreases, the collector current of the second BJT 314 also decreases.

When the temperature at the switching transistor 102 rises to a predetermined temperature, the collector current of the second BJT 314 decreases to a sufficiently low level such that the relay switch 301 opens. Since the coil 302 is coupled to the collector of the second BJT 314, the current flowing through the coil 302 is not sufficient to close the relay switch 301. Thus, when the temperature at the switching transistor 102 reaches the predetermined temperature, the power source from the battery system 333 of the vehicle is open-circuited from the drain of the switching MOSFET 102. In that case, current does not flow from the power source 333 through the switching MOSFET 102. Thus, the present invention thereby prevents overheating of the switching MOSFET 102 from excessive current flow through the effective resistance 110 of the switching MOSFET 102.

The latching circuit 210 of FIG. 2 is comprised of the first BJT 312 and a third BJT (Bipolar Junction Transistor) 326 in FIG. 3. A sixth resistor 328 and a seventh resistor 330 form a voltage divider for biasing the base of the third BJT 326. The first BJT 312 which is an NPN BJT and the third BJT 326 which is a PNP BJT are coupled in a latching configuration. In that configuration, the base of the first BJT 312 is coupled to the collector of the third BJT 326, and the base of the third BJT 326 is coupled to the collector of the first BJT 312.

The latching circuit 210, comprising the first BJT 312 and the third BJT 326 in FIG. 3, operates in the following manner. When the temperature of the switching transistor 102 rises and the resistance of the thermistor 304 increases, the voltage at the base of the first BJT 312 increases. The first BJT 312 turns on with more current from the increase of its base voltage.

The collector of the first BJT 312 is coupled to the base of the third BJT 326. Thus, when the first NPN BJT 312 has higher collector current, the third PNP BJT 326 also turns on with more current since the higher collector current of the first BJT 312 results in higher base current of the third BJT 326. In turn, when the third PNP BJT 326 turns on with higher collector current, the first BJT 312 also turns on with more current since the higher collector current of the third BJT 326 results in higher base current of the first BJT 312. Thus, the first BJT 312 and the third BJT 326 are coupled in a latching configuration and keep each other turned on once one of the two BJTs 312 and 326 turns on.

Since the first BJT 312 is maintained on in this manner, the second BJT 314 is kept turned off once the switching transistor 102 reaches the predetermined temperature. With the second BJT 314 turned off, the relay switch 301 is also maintained to be open until the temperature at the MOSFET 102 decreases below the predetermined temperature and until the power source 333 is removed and reapplied to the protection circuit 202 of the present invention. The power source 333 may be removed and reapplied from the ignition system 335 of the vehicle having the daytime running light 106. Alternatively, the power source 333 may be removed and reapplied to the protection circuit 202 by disconnecting and then reconnecting the power source 333 via any other mechanisms known to one of ordinary skill in the art.

Thus, with such a latching circuit 210, the daytime running light 106 is maintained off once the switching transistor 102 overheats. Thus, the traffic hazard and the faster degradation of the switching transistor 102, which may result when the daytime running light flashes on and off, are avoided with the latching circuit 210.

In this manner, the protection circuit of the present invention prevents destruction or degradation of the switching transistor 102 from overheating when a partial short load 108 is coupled to the switching transistor 102. The first fuse 331 is typically included with the battery system 333, and the second fuse 332 is typically included with the ignition system 335 of the vehicle. These fuses 331 and 332 prevent excessive current flow through the battery system 333. However, when a partial short load 108 is coupled to the switching transistor, the impedance of the partial short load 108 may not be low enough to blow those fuses 331 and 332.

Nevertheless, the impedance of the partial short load 108 may be low enough to cause excessive current to flow through the switching transistor 102. Such excessive current flowing through the MOSFET 102 may result in the effective resistance 110. If a conductive path from the power source 333 through the effective resistance 110 remains, excessive heat or even a fire may be generated resulting in malfunction of the daytime running light system.

Figure 1:
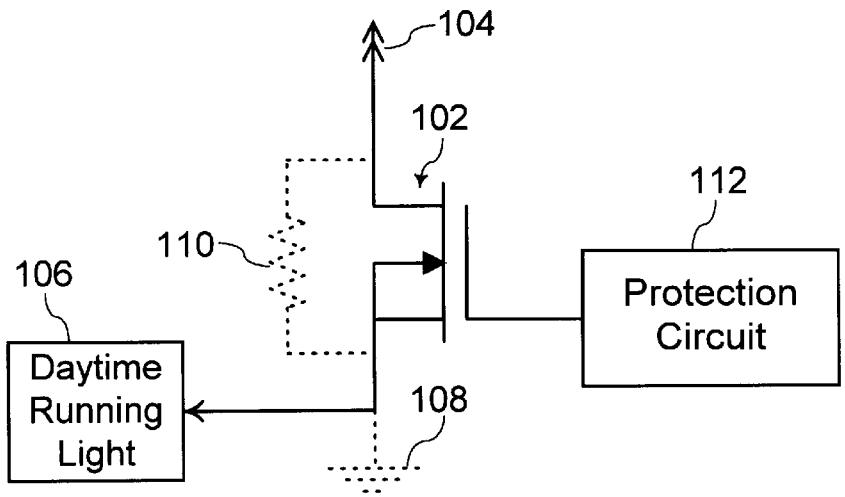
FIG. 1 shows a switching transistor for delivering power to a daytime running light on a vehicle and shows a protection circuit for protecting the switching transistor from overheating, according to the prior art.

By open-circuiting the switching transistor 102 from the power source 333 when overheating is detected, current is cut-off from the switching transistor 102 immediately upon detection of overheating. In contrast to the prior art protection circuit of FIG. 1, current does not continue to flow through the effective resistance 110 upon damage to the MOSFET 102. The prior art protection circuit of FIG. 1 controls the gate voltage of the switching transistor 102. Thus, in the prior art, current may continue to flow through the effective resistance 110 upon damage to MOSFET 102 since a conductive path from the power source through the effective resistance 110 remains.

Figure 4:
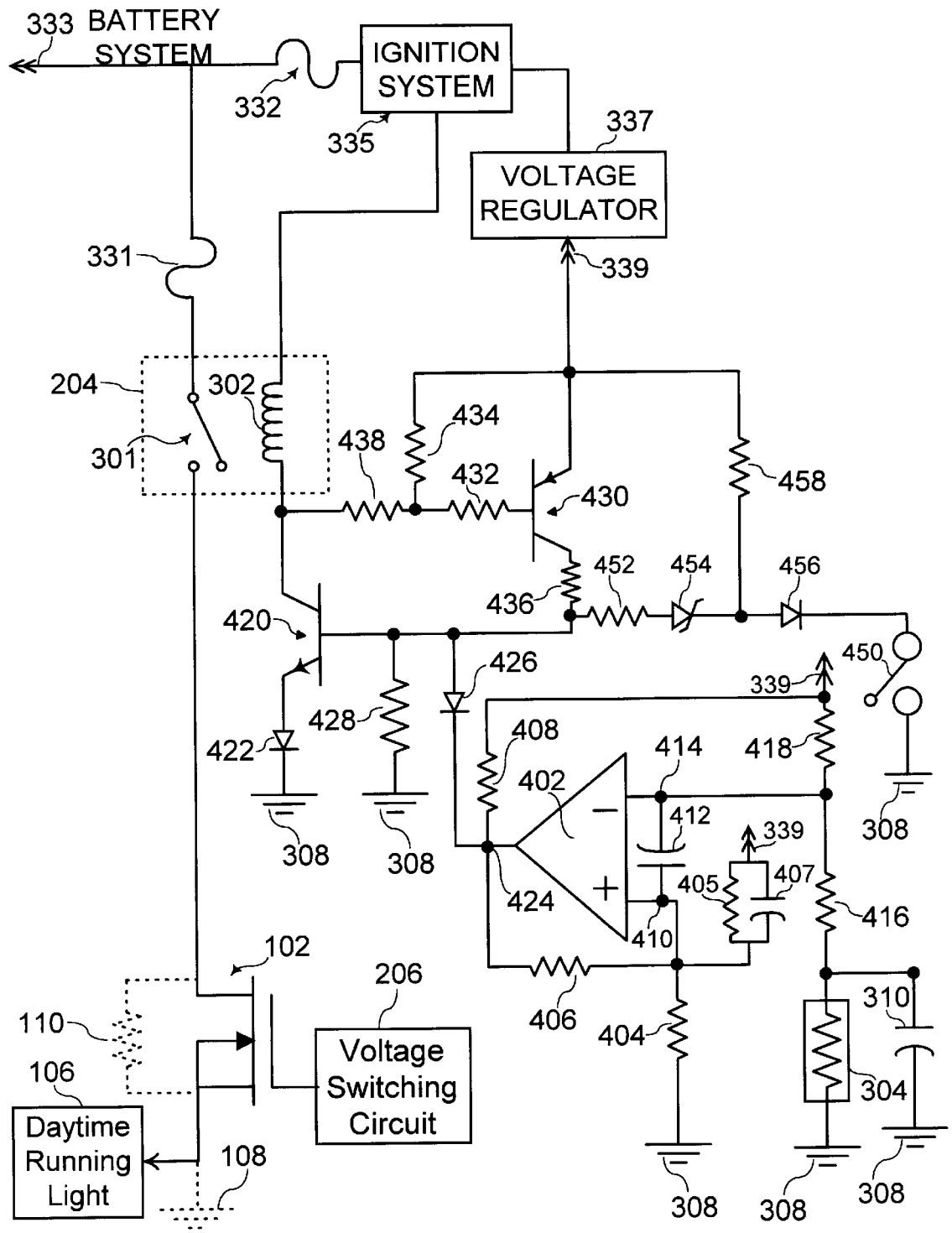
FIG. 4 shows implementation of the protection circuit for protecting the switching transistor as shown in FIG. 2, according to another embodiment of the present invention.

Referring to FIG. 4, an alternative implementation of the protection circuit 202 of FIG. 2 includes the control circuit 208 having a comparator 402. Referring to FIG. 4, a first resistor 404 and a second resistor 405 with a first coupling capacitor 407 set a reference voltage at a positive node 410 of the comparator 402. A second coupling capacitor 412 is coupled between the positive node 410 and a negative node 414 of the comparator 402. The thermistor 304 is coupled to the negative node 414 of the comparator 402 through a third resistor 416. A bias voltage at the negative node 414 of the comparator 402 is set by the third resistor 416 and a fourth resistor 418.

Referring to FIG. 4, the control circuit 208 also includes a first BJT (Bipolar Junction Transistor) 420 having its collector coupled to the coil 302 of the switching device 204. The first BJT has an emitter coupled to ground 308 via a first diode 422. The base of the first BJT 420 is coupled to an output node 424 of the comparator 402 via a second diode 426. The base of the first BJT 420 is also coupled to ground via a fifth resistor 428. The first resistor 404, a sixth resistor 406, and a seventh resistor 408 set a bias voltage at the output node 424 of the comparator 402. The sixth resistor 406 also forms a feedback circuit between the positive node 410 and the output node 424 of the comparator 402.

The control circuit 208, as implemented in FIG. 4 with the comparator 402 and the first BJT 420, operates in the following manner. A reference voltage is set at the positive node 410 of the comparator 402 by the voltage divider comprising the first resistor 404 and the second resistor 405 coupled between the regulated voltage node 339 and the ground node 308. Initially, when the temperature at the thermistor 304 is low, the voltage at the output node 424 of the comparator 402 is high.

When the temperature at the switching transistor 102 rises (such as when the partial short load 108 is coupled to the switching transistor 102 for example), the temperature and resistance of the thermistor 304 increase. As the resistance of the thermistor 304 increases, the voltage at the negative node 414 of the comparator 402 increases. As the resistance of the thermistor 304 increases, eventually, the voltage at the negative node 414 exceeds the reference voltage set at the positive node 410 of the comparator 402. In that event, the voltage at the output node 424 of the comparator 402 decreases dramatically to a low voltage. As a result, the base voltage of the first BJT 420 decreases to a low voltage, and the collector current through the first BJT 420 decreases.

When the temperature at the switching transistor 102 reaches a predetermined temperature, the collector current of the first BJT 420 decreases to a sufficiently low level such that the relay switch 301 opens. In that case, the current flowing through the coil 302 is not sufficient to close the relay switch 301. Thus, when the temperature at the switching transistor 102 reaches the predetermined temperature, the power source 333 is open-circuited from the drain of the switching MOSFET 102. In that case, current cannot flow from the power source 333 through the effective resistance 110 of the switching MOSFET 102. Thus, the present invention thereby prevents further overheating of the switching MOSFET 102 from continuous current flow after initial damage to the MOSFET 102.

Referring to FIG. 4, the alternative implementation of the protection circuit also includes a latching circuit comprised of the sixth resistor 406 and the first BJT 420. The sixth resistor 406 forms a feedback circuit in the feedback path from the positive input node 410 to the output node 424 of the comparator 402. When the temperature at the thermistor 304 has reached the predetermined temperature resulting in low voltage at the output node 424, the sixth resistor 406 is effectively in parallel connection with the first resistor 404.

With such a feedback circuit, the positive input node 410 of the comparator 402 is maintained to have a low voltage. Thus, even if the temperature at the thermistor 304 decreases back down, the voltage at the negative input 414 remains higher than the low voltage maintained at the positive input node 410. Thus, the output node 304 is latched to remain in a low voltage, and the relay switch 301 is maintained to be open.

This latching of the relay switch 301 may be reset when the temperature at the MOSFET 102 decreases below the predetermined temperature and by removing and reapplying the power source 333 to the protection circuit of the present invention. The power source 333 may be removed and reapplied from the ignition system 335 of the vehicle having the daytime running light 106. Alternatively, the power source 333 may be removed and reapplied to the protection circuit 202 by disconnecting and then reconnecting the power source 333 via any other mechanisms known to one of ordinary skill in the art.

With such a latching circuit, the daytime running light is maintained off once the switching transistor 102 overheats to the predetermined temperature. Thus, the traffic hazard and faster degradation of the switching transistor 102, which may result when the daytime running light flashes on and off, are avoided with the latching circuit.

The alternative implementation of the protection circuit of FIG. 4 also includes a parking brake latching circuit comprised of a second BJT 430 coupled to the first BJT 420 and to a parking brake switch 450 of a parking brake system on the vehicle having the daytime running light 106. An eighth resistor 432 and a ninth resistor 434 bias the base of the second BJT 430. The collector of the second BJT 430 is coupled to the base of the first BJT 420 through a tenth resistor 436. The collector of the first BJT 420 is coupled to the base of the second BJT 430 through an eleventh resistor 438. In this manner the first BJT 420 and the second BJT 430 are coupled in a latching configuration.

A first node of the parking brake switch 450 is coupled to the base of the first BJT 420 via a twelfth resistor 452, a third diode 454, and a fourth diode 456. The first node of the parking brake switch 450 is also coupled to the regulated voltage node 339 from the voltage regulator 337 via a thirteenth resistor 458 and the fourth diode 456. A second node of the parking brake 450 is coupled to the ground node 308.

Before the vehicle is started, the parking brake system is turned on such that the vehicle is in parked mode. When the vehicle is started, the daytime running light 106 is maintained to be turned off such that all of the battery power from the battery system 333 is used to start the vehicle. The latching configuration of the first BJT 420 and the second BJT 430 ensures that the daytime running light 106 is maintained off when the vehicle is in parked mode as now described herein.

When the parking brake system is turned on, the parking brake switch 450 is closed to couple the base of the first BJT 420 to the ground node 308. With the base of the first BJT 420 coupled to the ground node 308, the first BJT 420 turns off. With the first BJT 420 turned off, the second BJT 430 is also turned off because of the latching configuration of the first BJT 420 and the second BJT 430. In addition, the first BJT 420 and the second BJT 430 continue to keep each other turned off because of the latching configuration. Thus, the daytime running light 106 is maintained off when the vehicle is in parked mode.

After the vehicle has started and the parking brake system is in drive mode, the parking brake switch 450 is turned off (i.e., the base of the first BJT 420 is open circuited from the ground node 308), and the voltage at the base of the first BJT 420 charges back up. Thus, the first BJT 420 turns on, and in turn, the second BJT 430 is also turned on. Subsequently, the latching configuration of the first BJT 420 and the second BJT 430 maintains the first BJT 420 and the second BJT 430 to be turned on regardless of the state of the parking brake switch 450 once the vehicle has been started. The first BJT 420 and the second BJT 430 may turn off subsequently when the temperature at the thermistor 304 is above the predetermined temperature.

The foregoing is by way of example only and is not intended to be limiting. For example, the advantageous features of the present invention may be used in conjunction with any other type of switching transistor 102 aside from just the example of the MOSFET. In addition, any type of sensor 304 for sensing the temperature at the switching transistor 102 may be used aside from just the example of the thermistor. Also, any type of switching device 204 aside from just the example of the relay switch may be used with the present invention. Furthermore, other implementations for the control circuit 208 and the latching circuit 210 as apparent to one of ordinary skill in the art may be used with the present invention.

Therefore, the present invention is limited only as defined in the following claims and equivalents thereof.

We claim:

1. A protection circuit for protecting a switching transistor from overheating, the switching transistor driving a daytime running light on a vehicle, the circuit comprising:

a sensor, operatively coupled to the switching transistor, for monitoring temperature at the switching transistor;

a switching device, operatively coupled between a power source and the switching transistor, the switching transistor delivering current from the power source to the daytime running light when the switching device is closed; and a control circuit, operatively coupled to the sensor and the switching device, for controlling the switching device to open when the sensor senses that the temperature at the switching transistor is greater than a predetermined temperature to open-circuit the switching transistor from the power source.

2. The protection circuit of claim 1, further comprising:

a latching circuit, operatively coupled to the switching device, for maintaining the switching device to be open until the temperature at the switching transistor is below the predetermined temperature and until the power source is reapplied to the protection circuit.

3. The protection circuit of claim 2, wherein the power source is reapplied to the protection circuit via an ignition system of the vehicle.

4. The protection circuit of claim 2, wherein the latching circuit includes a comparator having a feedback circuit coupled between a positive input node and an output node of the comparator.

5. The protection circuit of claim 2, wherein the latching circuit includes an NPN bipolar junction transistor and a PNP bipolar junction transistor connected in a latching configuration.

6. The protection circuit of claim 1, wherein the switching device is a relay switch.

7. The protection circuit of claim 1, wherein the sensor is a thermistor having a resistance that varies with temperature, the thermistor being coupled to a heat sink of the switching transistor.

8. The protection circuit of claim 1, wherein the switching transistor is a MOSFET, having a drain operatively coupled to the switching device, having a source operatively coupled to the daytime running light, and having a gate operatively coupled to a voltage switching circuit that drives the MOSFET.

9. A protection circuit for protecting a MOSFET, having a source that drives a daytime running light on a vehicle and having a gate that is driven with a voltage switching circuit, from overheating when a partial short load is coupled to the MOSFET, the circuit comprising:

a thermistor, operatively coupled to the MOSFET, the thermistor having a resistance that varies with temperature for monitoring temperature at the MOSFET;

a relay switch, operatively coupled between a power source and a drain of the MOSFET, the MOSFET delivering current from the power source to the daytime running light when the relay switch is closed;

a control circuit, operatively coupled to the thermistor and the relay switch, for controlling the relay switch to open when the thermistor senses that the temperature at the MOSFET is greater than a predetermined temperature to open-circuit the MOSFET from the power source; and a latching circuit, operatively coupled to the relay switch, for maintaining the relay switch to be open until the temperature at the switching transistor is below the predetermined temperature and until the power source is reapplied to the protection circuit, wherein the latching circuit includes an NPN bipolar junction transistor and a PNP bipolar junction transistor connected in a latching configuration.

10. A daytime running light system on a vehicle, the daytime running light system comprising:

a daytime running light bulb;

a battery system;

a switching transistor coupled between the battery system and the daytime running light bulb, that couples the battery system to the daytime running light bulb; and a protection circuit for protecting the switching transistor from overheating, the circuit comprising:

a sensor, operatively coupled to the switching transistor, for monitoring temperature at the switching transistor;

a switching device, operatively coupled between the battery system and the switching transistor, the switching transistor delivering current from the battery system to the daytime running light bulb when the switching device is closed; and a control circuit, operatively coupled to the sensor and the switching device, for controlling the switching device to open when the sensor senses that the temperature at the switching transistor is greater than a predetermined temperature to open-circuit the switch transistor from the battery system.

11. The daytime running light system of claim 10, further including:

an ignition system coupled between the battery system and the switching transistor, the switching transistor coupling the battery system to the daytime running light bulb when the ignition system is turned on.

12. The daytime running light system of claim 10, wherein the protection circuit further comprises:

a latching circuit, operatively coupled to the switching device, for maintaining the switching device to be open until the temperature at the switching transistor is below the predetermined temperature and until the battery system is reapplied to the protection circuit.

13. The protection circuit of claim 12, wherein the latching circuit includes a comparator having a feedback circuit coupled between a positive input node and an output node of the comparator.

14. The daytime running light system of claim 12, wherein the latching circuit includes an NPN bipolar junction transistor and a PNP bipolar junction transistor connected in a latching configuration.

15. The daytime running light system of claim 10, wherein the switching device is a relay switch.

16. The daytime running light system of claim 10, wherein the sensor is a thermistor having a resistance that varies with temperature, the thermistor being coupled to a heat sink of the switching transistor.

17. The daytime running light system of claim 10, wherein the switching transistor is a MOSFET, having a drain operatively coupled to the switching device, having a source operatively coupled to the daytime running light, and having a gate operatively coupled to a voltage switching circuit that drives the MOSFET.

18. The daytime running light system of claim 10, further including
a parking brake latching circuit for maintaining the daytime running light bulb to be maintained off when the vehicle is in parked mode before the vehicle has been started.

19. A protection circuit for protecting a switching transistor from overheating, the switching transistor driving a daytime running light on a vehicle, the circuit comprising:
means for monitoring temperature at the switching transistor;
means for delivering current from a power source through the switching transistor to the daytime running light when the temperature at the switching transistor is below a predetermined temperature; and
means for open-circuiting the power source from the switching transistor when the temperature at the switching transistor is greater than the predetermined temperature.

20. The protection circuit of claim 19, further comprising:
means for maintaining an open-circuit between the power source and the switching transistor until the temperature at the switching transistor is below the predetermined temperature and until the power source is reapplied to the protection circuit.

21. The protection circuit of claim 20, wherein the means for maintaining an open-circuit includes a comparator having a feedback circuit coupled between a positive input node and an output node of the comparator.

22. The protection circuit of claim 20, wherein the means for maintaining an open-circuit includes an NPN bipolar junction transistor and a PNP bipolar junction transistor connected in a latching configuration.

23. The protection circuit of claim 19, wherein the switching transistor is a MOSFET, having a source operatively coupled to the daytime running light, and having a gate operatively coupled to a voltage switching circuit that drives the MOSFET, and having a drain that is open-circuited from the power source when the temperature at the MOSFET is greater than the predetermined temperature.

24. A method for protecting a switching transistor from overheating, the switching transistor driving a daytime running light on a vehicle, the method including the steps of:
monitoring temperature at the switching transistor;
controlling a switching device, operatively coupled between the switching transistor and a power source, to be closed when the temperature at the switching transistor is less than a predetermined temperature, the switching transistor delivering current from the power source to the daytime running light when the switching device is closed; and
controlling the switching device to be open when the temperature at the switching transistor is greater than the predetermined temperature to open-circuit the switching transistor from the power source.

25. The method of claim 24, further including the step of:
maintaining the switching device to be open with a latching circuit until the temperature at the switching transistor is below the predetermined temperature and until the power source is reapplied to the latching circuit.

26. The method of claim 25, wherein the latching circuit includes a comparator having a feedback circuit coupled between a positive input node and an output node of the comparator.

27. The method of claim 25, wherein the latching circuit includes an NPN bipolar junction transistor and a PNP bipolar junction transistor connected in a latching configuration.

28. The method of claim 24, wherein the switching transistor is a MOSFET, having a source operatively coupled to the daytime running light, and having a gate operatively coupled to a voltage switching circuit that drives the MOSFET, and having a drain that is open-circuited from the power source when the temperature at the MOSFET is greater than the predetermined temperature.

* * * * *